United States Patent [19]

Elsaesser

[11] Patent Number: 4,946,760

[45] Date of Patent: Aug. 7, 1990

[54] RADIATION-SENSITIVE MIXTURE

[75] Inventor: Andreas Elsaesser, Idstein, Fed. Rep. of Germany

[73] Assignee: Hoechst Aktiengesellschaft, Frankfurt am Main, Fed. Rep. of Germany

[21] Appl. No.: 265,838

[22] Filed: Nov. 1, 1988

[30] Foreign Application Priority Data

Nov. 6, 1987 [DE] Fed. Rep. of Germany ....... 3737734

[51] Int. Cl.$^5$ .............................................. G03C 5/04
[52] U.S. Cl. ..................................... 430/270; 430/300; 430/302; 430/344; 430/914; 430/919; 430/925; 522/109; 522/110; 522/134; 522/136
[58] Field of Search ............... 430/270, 302, 300, 344, 430/914, 919, 925; 522/109, 110, 134, 136

[56] References Cited

U.S. PATENT DOCUMENTS

| | | | |
|---|---|---|---|
| 3,779,778 | 12/1973 | Smith et al. | 96/115 R |
| 3,915,706 | 10/1975 | Limburg et al. | 96/27 R |
| 3,917,483 | 11/1975 | Limburg et al. | 96/27 R |
| 3,984,253 | 10/1976 | Nelson | 96/35.1 |
| 4,101,323 | 7/1978 | Buhr et al. | 96/35 |
| 4,247,611 | 1/1981 | Sander et al. | 430/270 |
| 4,248,957 | 2/1981 | Sander et al. | 430/270 |
| 4,294,909 | 10/1981 | Lee | 430/270 |
| 4,311,782 | 1/1982 | Buhr et al. | 430/270 |
| 4,356,252 | 10/1982 | Lee | 430/270 |
| 4,458,000 | 7/1984 | Stahlhafer | 430/270 |
| 4,506,003 | 3/1985 | Ruckert et al. | 430/270 |
| 4,506,006 | 3/1985 | Ruckert et al. | 430/270 |
| 4,678,737 | 7/1987 | Schneller et al. | 430/270 |

*Primary Examiner*—Paul R. Michl
*Assistant Examiner*—Thorl Chea
*Attorney, Agent, or Firm*—Foley & Lardner, Schwartz, Jeffery, Schwaab, Mack, Blumenthal & Evans

[57] ABSTRACT

A radiation-sensitive mixture, in particular photosensitive mixture, is disclosed that contains a compound which forms a strong acid on exposure to actinic radiation and a polymeric reaction product of (i) a polymeric organic compound containing free OH groups, (ii) an organic compound containing at least two isocyanate groups or at least two epoxy groups, and (iii) a compound containing repeating acid-cleavable acetal or ketal groups and at least one free OH group. The mixture yields printing plates or photoresists with a longer storage life.

9 Claims, No Drawings

RADIATION-SENSITIVE MIXTURE

BACKGROUND OF THE INVENTION

The present invention relates to a positiveworking, radiation-sensitive mixture comprising a compound which forms a strong acid on exposure to actinic radiation, a compound containing at least one acid-cleavable C-0-C bond and, optionally, a polymeric binder.

The mixture is suitable, in particular, for producing printing plates and photoresists.

Such mixtures and copying materials that can be produced therefrom are known and are described, for example, in US-A-3,915,706, 3,917,483, 3,779,778 and 3,984,253, in DE-A-2,610,842, 2,718,254 and 3,023,201 and in EP-A22,571. They are considerably more photosensitive than the otherwise standard positive-working, radiation-sensitive copying materials based on 1,2-quinone diazides.

A disadvantage of these copying materials is that, in combination with the base materials standard for photolithographic and reprographic long-term applications, for example aluminum, copper, steel, zinc, brass, chromium and plastic films, they do not have a satisfactory storage life. The inadequate storage stability is manifested in a gradual decrease in the photosensitivity of the radiation-sensitive layers until a satisfactory development of the layers is no longer possible and the materials can no longer be used for photolithographic and reprographic applications.

Furthermore, relatively narrow conditions have to be adhered to in the baking necessary, or at least advantageous, and standard between exposure and development. In German Patent Application P 3,715,790, it has been proposed that these disadvantages be avoided by applying a developer-soluble covering layer, for example of polyvinyl alcohol, to the radiation-sensitive layer. This measure results in a marked improvement, but the double coating is technologically more expensive and the accumulation of the high-polymeric constituents of the covering layer in the developer results in its more rapid exhaustion or in a higher consumption respectively.

DE-C-2,306,248 describes, inter alia, polymeric acid-cleavable acetal which contain acetal groups either in the main chain or in side chains. In the latter case for example, the phenolic hydroxyl groups of phenolic resins are acetalized. The aromatic acetal groups produced yield mixtures with lower photosensitivity than purely aliphatic acetal; the solubility differentiation achieved in cleaving these compounds is also often inadequate.

DE-C-2,718,254 describes purely aliphatic polyacetals, and mention is made of the fact that their molecular weight can be increased by reaction with diisocyanates or diepoxides. However, the polymeric compounds obtained in this process also yield mixtures with markedly reduced photosensitivity.

SUMMARY OF THE INVENTION

It is therefore an object of the present invention to provide positive-working, radiationsensitive or photosensitive mixtures and also copying materials based on acid-cleavable compounds that have a better storage life than the mixtures of this type hitherto known, that permit a wider tolerance in the baking of the exposed materials before development and that do not require any additional covering layer.

According to the invention a radiationsensitive mixture is proposed comprising a compound which forms a strong acid on exposure to actinic radiation, and a polymeric compound containing repeating acid cleavable acetal or ketal groups.

The polymeric compound is the reaction product of:
(i) a polymeric organic compound containing free OH groups,
(ii) an organic compound containing at least two isocyanate groups or at least two epoxy groups, and
(iii) a compound containing repeating acid cleavable acetal or ketal groups and at least one free OH group.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Within the scope of this invention, the term "photosensitive" includes all systems that are sensitive to electromagnetic radiation in the general sense, i.e., to infrared, visible and ultraviolet light, and high-energy radiation, such as X-ray radiation, electron radiation and other corpuscular radiation. Preferably, the sensitivity is in the short-wave visible region or in the near to central ultraviolet region. The compound that forms acid as a result of radiation may, however, also be resistant towards light, for example daylight, and sensitive towards electron radiation or X-ray radiation. Laser-radiation may also possibly be used for image formation.

Suitable polymeric compounds (i) containing free OH groups, in particular phenolic OH groups, are primarily phenolic resins, preferably novolaks. In addition to the phenol-aldehyde and alkylphenolaldehyde condensation resins, condensation resins of naphthols, as are described in US-A-4,551,409, or condensation resins of ketones and phenols, for example pyrogallol-acetone resins, may also be used. The polymers of vinylphenols, such as those described in DE-A-3,406,927, the polymers of N-(4-hydroxyphenyl)maleimides described in EP-A-187,517, or the polymers containing phenolic OH groups described in DE-A-3,528,929 are also suitable. Furthermore, modified phenolic resins, for example the polymers specified in EP-A-150,315 or DE-A-2,429,251, or polyamide carboxylic acids containing free phenolic hydroxyl groups may be used.

Suitable compounds (iii) containing acid-cleavable acetal or ketal groups which are introduced as side chains into the polymers containing free OH groups are the polyacetals described in DE-C-2,306,248 and, in particular, 2,718,254. Preferred are the polyacetals or polyketals in which each α-carbon atom of the alcohol components is a saturated aliphatic or cycloaliphatic, in particular, primary carbon atom. In principle, all such compounds may be used, provided they have free hydroxyl groups or other functional groups capable of reacting with isocyanate groups or epoxy groups.

The compounds (ii) containing isocyanate groups or epoxy groups, include those compounds containing two or more, but preferably two, such functional groups that are then able to act as crosslinking agents. Examples are toluylene diisocyanate or its uretdione, diphenylmethane-4,4'-diisocyanate, naphthalene-1,5-diisocyanate, hexamethylene-1,6-diisocyanate, 3,3,5-trimethylhexamethylene diisocyanate, isophorone diisocyanate and 4,4'-diisocyanatodicyclohexylmethane. Examples of bifunctional epoxy compounds are the diglycidyl ethers of diphenols, for example the condensation products of epichlorohydrin and hydroquinone, 4,4'-dihydroxydiphenyl, 4,4'-dihydroxydiphenylpropane (bisphenol A), 4,4'-dihydroxydiphenylsulfone or 1,5-dihydroxynaphthalene. Preferred are the products based on bisphenol A that are also commercially available in higher degrees of condensation, for example with epoxide equivalent weights of 180 to 4,000.

Some of the crosslinking agents may also be replaced by monofunctional compounds such as, for example, phenyl isocyanate or phenyl glycidyl ether if a smaller degree of crosslinking is desirable or necessary. Equally, some of the bifunctional cross-linking agents can be replaced by polyfunctional ones, such as, for example, biuret triisocyanate (Desmodur N made by Bayer AG), triphenylmethane triisocyanate (Desmodur R made by Bayer AG), and also the trifunctional isocyanates Desmodur L and IL made by Bayer AG or glycidyl ethers of novolaks (ECN resins made by Ciba-Geigy AG).

The reaction is normally carried out in solution in two stages, preferably at elevated temperature and/or in the presence of a catalyst. In the first stage the acid-cleavable polyacetal is reacted with crosslinking agent to form a prepolymer containing epoxy or isocyanate groups capable of yet further reaction. The completeness of this reaction can be checked with the common analytical methods for determining isocyanate or epoxy contents, i.e., a determination is made of when the calculated quantity of NCO or epoxy groups have reacted. The prepolymers obtained are then reacted with the polymer containing OH groups until epoxy or isocyanate groups respectively can virtually no longer be detected.

The ratio of crosslinking agent to acid-cleavable compound is in general so chosen that there is one crosslinking agent molecule for each free hydroxyl group of the acid-cleavable compound. If, for example, diisocyanates are used as crosslinking agents, the reaction product of the first stage contains, as a rule, a mixture of homologs of oligomers containing diurethane units and polyacetal blocks, the diisocyanate having a central polyacetal sequence and two terminal isocyanate groupings bound via urethane groups mainly being produced with the preferred molar ratio of polyacetal to diisocyanate of 1:2. Depending on the desired crosslinking density, it is, however, also possible to exceed or be below this ratio.

In the second stage of the reaction, ratios are preferably chosen of markedly more than 1 mol of hydroxyl groups of the polymeric binder per mol of epoxide or isocyanate.

The most favorable molar ratio is determined in each case by simple trials. In each case, care must be taken to insure that the quantitative proportion of crosslinking agent is low enough so that the end product still remains soluble in coating solvents. On the other hand, to achieve as large a solubility difference as possible between exposed and unexposed regions of the photosensitive mixture, it may be desirable to choose a proportion of crosslinking agent containing polyacetal groups that is as high as possible in the reaction mixture.

Typical solvents for the reaction are those that do not contain active hydrogen atoms, for example acetone, butanone, dimethylformamide, dioxane, tetrahydrofuran, 1,2-dimethoxyethane, and dichloroethane. Suitable catalysts include tertiary amines, such as triethylamine, N-methylmorpholine, diazabicyclooctane, dimethylaniline, and dimethylaminopyridine.

To produce radiation-sensitive mixtures, the compounds described are combined with a compound that forms a strong acid on exposure to actinic radiation and, optionally, a polymeric binder that does not contain any acid-cleavable groups.

Suitable as such polymeric binders are water-insoluble binders that are soluble or at least swellable in aqueous alkaline solutions and organic solvents. These are essentially the same polymers used to react with the acid-cleavable compounds and the crosslinking agents. The quantity of these binders may vary very considerably depending on application and reaction product used. In many cases, it is possible to dispense with these binders altogether.

In general, the quantitative proportion, based on the nonvolatile constituents of the mixture, is about 0 to 65% by weight, preferably 0 to 50% by weight. The quantitative proportion of cleavable compound is usually about 35–99.5% by weight, preferably about 40–99% by weight.

Additionally, other polymers can also be used at the same time and these may be either water-soluble or, alternatively, alkali-insoluble. These other polymers preferably include vinyl polymers, such as polyvinyl acetates, polyacrylates, polyvinyl ethers and polyvinylpyrrolidones, which may themselves be modified by comonomers. The most favorable proportion of these resins depends on the application requirements and the effect on the development conditions, and is, in general, not more than about 20% of the alkali-soluble binder. For specific requirements, such as flexibility, adhesion, gloss, etc., the photosensitive layer may also contain substances such as polyglycols, cellulose ethers, for example ethylcellulose, wetting agents, dyestuffs and finely-divided pigments, in small quantities.

Suitable radiation-sensitive components that form or cleave off preferably strong acids on exposure include a large number of known compounds and mixtures, such as diazonium, phosphonium, sulfonium and iodonium salts, halogen compounds, oquinonediazidesulfochlorides and organometallic-organo-halogen combinations.

The diazonium, phosphonium, sulfonium and iodonium compounds mentioned are, as a rule, used in the form of their salts that are soluble in organic solvents, usually as deposition products with complex acids, such as tetrafluoroboric acid, hexafluorophosphoric acid, hexafluoroantimonic acid and hexafluoroarsenic acid.

In principle, all the organic halogen compounds that are known as photochemical radical starters, for example those containing more than one halogen atom on a carbon atom or in an aromatic ring, can be used as halogen-containing, radiation-sensitive compounds that form hydrohalic acid. Examples are described in US-A-3,515,552, 3,536,489 and 3,779,778, in DE-C-2,610,842 and in DE-A-2,243,621, 2,718,259 and 3,337,024. Of these compounds, the s-triazine derivatives containing 2 halomethyl groups, in particular trichloromethyl groups, and an aromatic or unsaturated substituent in the triazine ring, such as those described in DE-A-

2,718,259 and 3,337,024, are preferred. The action of these halogen-containing compounds may also be spectrally affected and increased by known sensitizers.

Examples of suitable starters include: 4-(di-n-propylamino)-benzenediazonium tetrafluoroborate, 4-p-tolylmercapto-2,5-diethoxybenzenediazonium hexafluorophosphate and tetrafluoroborate, diphenylamine4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bis(dibromomethyl)benzene, tris(dibromomethyl)-s-triazine, 2-(6-methoxy-2-naphthyl)-, 2-(1-naphthyl)-, 2-(2-naphthyl)-, 2-(4-ethoxyethyl-1-naphthyl)-, 2-(3-benzopyranyl)-, 2-(4-methoxy-1-anthracyl)-, 2-(4-styrylphenyl)-, 2-(9-phenanthryl)-4,6-bis(trichloromethyl)-s-triazine and the compounds cited in the examples.

The quantity of starter may likewise be very different depending on its chemical nature and the composition of the layer. Favorable results are obtained with about 0.1 to 10% by weight, based on total solids, and about 0.2 to 5% are preferred. It is advisable to use relatively little acid donor, particularly for copying layers having thicknesses above about 0.01 mm.

Finally, soluble or finely-divided dispersible dyestuffs, and, depending on application, also UV absorbers may be added to the photosensitive layer.

The triphenylmethane dyestuffs, in particular in the form of their carbinol bases, have proved particularly successful as dyestuffs. The most favorable quantitative ratios of the components can easily be determined in an individual case by preliminary trials.

The layer thickness of the radiation-sensitive or photosensitive layer depends essentially on the application for the material. It may, in general, be between about 500 nm and 0.08 mm, preferably between about 0.001 to 0.05 mm. For printing plates and photoresist layers to be applied from solution, layer thicknesses in the region of about 0.001 to 0.01 mm are preferred.

To coat the base material, the layer constituents are, in general, dissolved in a solvent. The choice of solvent depends on the coating process, the layer thickness and the drying conditions. In principle, all solvents are suitable that are compatible with the layer constituents, such as, for example, alcohols, ketones, esters, chlorinated hydrocarbons, etc. Preferred are mixtures containing glycol ethers.

Suitable layer bases for the photosensitive mixtures are all the materials usually employed industrially in copying processes. As examples, mention may be made of plastic films, insulating boards with copper cladding, mechanically or electrochemically roughened and optionally anodized aluminum, screen printing template bases, wood, ceramic, glass and silicon whose surface may have been converted chemically, for example, into silicon nitride or silicon dioxide.

Preferred bases for thick layers above about 0.01 mm are plastic films that then serve as temporary bases for transfer layers. For these and for color films, polyester films, for example composed of polyethylene terephthalate, are preferred. Polyolefin films, such as polypropylene are, however, also suitable. As layer bases for layer thicknesses below about 0.01 mm, metals are usually used. Mechanically, chemically or electrolytically roughened and optionally anodized aluminum that may in addition also have been pretreated chemically, for example, with polyvinylphosphonic acid, silicates or phosphates may be used for offset printing plates.

Finally, the coating can be carried out, directly or by layer transfer from the temporary layer base, to conductor board materials composed of insulating boards with single- or double-sided copper cladding, to glass or ceramic materials, that may have been pretreated in an adhesion-promoting manner, and to silicon wafers.

The standard equipment and conditions may be adopted for drying after coating, and temperatures around 100° C., and for a short period of up to 120° C., can be tolerated without loss of radiation sensitivity.

The standard light sources, such as tubular lamps, pulsed xenon lamps, metal-halide-doped mercury vapor high-pressure lamps and carbon-arc lamps may be used for exposure.

Advantageously, laser-irradiation equipment, in particular automatic processing units, are used which contain an argon-ion laser as radiation source.

The irradiation may also be carried out with electron beams. In this case, it is also possible to use acid-forming compounds that are not photosensitive in the usual sense as initiators of the solubilizing reaction, for example halogenated aromatic compounds or halogenated polymeric hydrocarbons. X-ray beams or ion beams may also be used for image production.

The layer that has been exposed to an image or irradiated can be removed in a known manner with the developers known for commercial naphthoquinonediazide layers and photoresists and the new materials can be advantageously adapted in their copying behavior to the known aids such as developers and programmed spray development equipment. The aqueous developer solutions may contain, for example, alkali-metal phosphates, silicates, borates or hydroxides; also wetting agents and, optionally, smaller proportions of organic solvents. In particular cases, solvent-water mixtures may also be used as developers. The choice of the most favorable developer may be determined by trials with the particular layer used. If necessary, the development may be promoted by mechanical means.

If used as printing plates, the developed plates can be heated for a short time to elevated temperatures, as is known for diazo layers from GB-A-1,154,749, to increase the resistance during printing and also the resistance to washing-out agents, correcting agents and printing inks that can be hardened by UV light.

Examples of preferred embodiments of the copying material according to the invention are specified below. In the examples, parts by weight (pbw) and parts by volume (pbv) are in the ratio of g to ccm. Unless otherwise specified, percentages and quantitative ratios are to be understood in units of weight.

General instructions for preparing the compounds 1-5

The polymeric acetal and the isocyanate were dissolved in a first quantity of butanone and then heated under reflux for two hours. The OH polymer in a second quantity of butanone was then added and the mixture was heated for a further two hours under reflux. A ready-to-use solution resulted. All quantities are specified in pbw.

TABLE I

| Compound | Polyacetal | Isocyanate | 1st quantity of butanone | OH polymer | 2nd quantity of butanone | Solid content of solution (%) |
|---|---|---|---|---|---|---|
| 1 | A 1 11.2 | I 1 7.35 | 118.0 | B 1 40.0 | 263.6 | 13.3 |
| 2 | A 2 24.0 | I 2 11 | 250.0 | B 1 43.6 | 195.4 | 15.0 |
| 3 | A 2 24.0 | I 2 10.4 | 150.0 | B 2 25.0 | 250.0 | 13.7 |
| 4 | A 3 24.0 | I 2 11.0 | 250.0 | B 3 12.0 | 64.5 | 13.0 |
| 5 | A 3 14.0 | I 2 11.0 | 197.0 | B 4 8.6 | 66.9 | 14.2 |

Isocyanates:
I 1 diphenylmethane 4,4'-diisocyanate
I 2 tolylene 2,4-diisocyanate Polyacetals:
A 1 polyacetal from butyraldehyde and triethylene glycol, hydroxyl number 146
A 2 polyacetal from 2-ethylbutyraldehyde and triethylene glycol, hydroxyl number 140
A 3 polyacetal from 2-methylbutyraldehyde and triethylene glcyol, hydroxyl number 142

Polymers containing OH groups:
B 1 poly-4-hydroxystyrene, Resin M supplied by Maruzen Petrochemical Co.
B 2 phenol-formaldehyde novolak, Alnovol PN 320 supplied by Hoechst AG
B 3 pyrogallol-acetone resin, PA-808 supplied by Gun Ei Chem. Ind. Co.
B 4 resorcinol-formaldehyde novolak, Alnovol VPN 99 supplied by Hoechst AG Instructions for preparing compound No. 6

20 pbw of polyacetal A 2 and 19 pbw of a diglycidyl ether of bisphenol A (Beckopox EP 140 supplied by Hoechst AG, epoxy equivalent weight 190) were heated under reflux together with 1 pbw of triethylamine in 152 pbw of tetrahydrofuran for 6 hours. Then 50 pbw of poly-4-hydroxystyrene in 353 pbw of tetrahydrofuran were added and allowed to react for a further 6 hours under reflux. A ready-to-use solution with a solid content of 15% by weight resulted.

EXAMPLES 1 to 6

These examples show the suitability of the compounds according to the invention in radiation-sensitive layers.

Coating solutions were prepared and spun onto aluminum plates electrolytically roughened in hydrochloric acid, anodized in sulfuric acid and rendered hydrophilic with polyvinylphosphonic acid, and dried at 100° C. for two minutes. Layer thicknesses of 1.8 μm resulted. The plates were exposed under a 5 kW metal halide lamp at a distance of 110 cm through a continuous tone step wedge having 13 steps with a density grading of 0.15, and they were developed, after waiting for ten minutes, for one minute in an aqueous alkaline developer of the following composition:

| | |
|---|---|
| 8.5 pbw | of $Na_2SiO_3.9H_2O$, |
| 0.8 pbw | of NaOH, |
| 1.5 pbw | of $Na_2B_4O_7.10H_2O$, |
| 89.2 pbw | of water |

Every coating solution contained 0.02 pbw of crystal violet base and the quantities of further constituents specified in Table II. 2-(4-Styrylphenyl)-4,6-bis(tri-chloromethyl)-s-triazine was used as photoinitiator and a cresol-formaldehyde novolak with a melting range of 105-120° C. as specified in DIN 53 181 was used as binder.

Table II further specifies the exposure time at which step 3 in the exposure wedge is clear.

TABLE II

| Example | Compound No., pbw of solution | Photoinitiator, pbw | Binder, pbw | Propylene glycol monomethyl ether, pbw | Exposure time, seconds |
|---|---|---|---|---|---|
| 1 | 1 32.1 | 0.23 | 1.83 | 66.17 | 11 |
| 2 | 2 32.56 | 0.25 | 1.22 | 65.97 | 10 |
| 3 | 3 35.8 | 0.23 | 1.20 | 63.1 | 10 |
| 4 | 4 32.8 | 0.25 | 1.83 | 65.12 | 13[1] |
| 5 | 5 26.1 | 0.23 | 2.4 | 71.6 | 10 |
| 6 | 6 40.66 | 0.23 | — | 59.43 | 9[1] |

[1]Developer solution was diluted with distilled water to double the volume.

EXAMPLE 7

This example shows the wide postbacking tolerance and the improved storage stability of the printing plates according to the invention compared with known printing plates. For this purpose, the printing plates of Examples 2 and 3 were used.

As a comparison, a printing plate was prepared in accordance with Examples 1 to 6 from the following coating solution:

| | |
|---|---|
| 4.7 pbw | of cresol-formaldehyde novolak (melting point by capillary method DIN 53 181: 105-120° C.), |
| 1.4 pbw | of polyacetal from 2-ethylbutyraldehyde and triethylene glycol, |
| 0.23 pbw | of 2-(4-styrylphenyl)-4,6-bis(trichloro-methyl)-s-triazine, and |
| 0.02 pbw | of crystal violet base in |
| 59.65 pbw | of propylene glycol monomethyl ether and |
| 34 pbw | of butanone. |

The following solution was spun onto some of these comparison plates:

| | |
|---|---|
| 4.0 pbw | of polyvinyl alcohol (K-value 8, 12% acetyl groups), |
| 1.0 pbw | of polyvinylpyrrolidone, (Luviskol K 30 supplied by BASF AG) |
| 0.05 pbw | of p-nonylphenol polyoxyethylene ether (approx. 10 oxyethylene units), |
| 94.95 pbw | of distilled water. |

A layer thickness of 500 nm was obtained after drying for two minutes 100° C. The remaining plates were left unchanged and served as a comparison.

The plates were exposed for ten seconds under a 5 kW metal halide lamp at a distance of 110 cm through a continuous tone step wedge having 13 density steps of 0.15 each and developed, after waiting for ten minutes, for thirty seconds in the developer of Example 1.

Table III gives the results. Column A specifies the number of clear steps for a waiting time of ten minutes at room temperature after exposure, and column B specifies the number of clear steps after heating for one minute at 100° C. after exposure. Column C specifies the storage stability at 100° C., and column D specifies the development behavior.

TABLE III

|  | A | B | C | D |
|---|---|---|---|---|
| Printing plate of Example 2 | 3 | 3 | more than 8 hours | Development satisfactory |
| Printing plate of Example 3 | 3 | 3 | more than 8 hours | Development satisfactory |
| Comparison printing plate without covering layer | 3 | 1 | less than 6 hours | Development satisfactory |
| Comparison printing plate with covering layer | 3 | 3 | more than 8 hours | Development impaired |

EXAMPLE 8

This example shows the suitability of the recording material according to the invention for preparing planographic printing plates.

An aluminum plate electrolytically roughened in nitric acid, anodized in sulfuric acid and rendered hydrophilic with polyvinylphosphonic acid was spin-coated with the following solution:

| 1.83 pbw | of novolak as in Example 1, |
| 32.1 pbw | of compound No. 1 (as solution), |
| 0.20 pbw | of 2-(4-styrylphenyl)-4,6-bis(trichloro-methyl)-s-triazine, and |
| 0.02 pbw | of crystal violet base in |
| 65.85 pbw | of butanone |

A layer thickness of 2,500 nm was obtained. The plate was exposed for eleven seconds to an image with a 5 kW metal halide lamp at a distance of 110 cm, heated for one minute at 80° C. and then developed in the developer from Example 1 for one minute. 100,000 impressions of satisfactory quality were obtained with the offset type form produced in this manner.

EXAMPLE 9

This example shows the suitability of the recording material according to the invention for image production with electron beams.

A solution of the following composition was spun onto mechanically roughened aluminum:

| 2.4 pbw | of novolak as in Example 1, |
| 16.1 pbw | of compound No. 5 (as solution), |
| 0.20 pbw | of 2-(4-ethoxy-1-naphthyl)-4,6-bis(trichloro-methyl)-s-triazine, and |
| 0.02 pbw | of crystal violet base in |
| 71.60 pbw | of butanone. |

A layer thickness of 1,000 nm was obtained. The irradiation was carried out with 11 kV electrons. With a beam current of $5 \times 10^{-6}$ A, an irradiation time of four seconds was sufficient to render a field of 10 square centimeters soluble after exposing to the developer from Example 1 for sixty seconds. This corresponds to a sensitivity of the above-mentioned layers of $2 \times 10^{-6}$ C/cm².

EXAMPLE 10

This example shows the suitability of the material according to the invention as etch resist. The following solution was applied to a copper plate by spinning:

| 5 pbw | of novolak as in Example 1, |
| 90 pbw | of compound No. 4 (as solution), |
| 0.5 pbw | of 2-(4-ethoxy-1-naphthyl)-4,6-bis(trichloro-methyl)-s-triazine, and |
| 0.1 pbw | of crystal violet base in |
| 31.7 pbw | of ethanol. |

A layer thickness of 0.025 mm resulted after drying for 10 minutes at 100° C. Exposure was carried out with a 5 kW metal halide lamp (distance 110 cm) for approximately 100 seconds and development was carried out, after a waiting time of 15 minutes, for 90 seconds using the developer specified in Example 1. The resist templates produced exhibited an outstanding resistance to etching and electroplating, in particular, during the electroplating build-up of copper and Pb/Sn alloy.

EXAMPLE 11

This example shows the suitability of the copying material according to the invention as high-resolution photoresist template.

The following solution which was filtered through a filter having a pore diameter of 200 nm (Millipore) was spun onto a silicon wafer covered with an $SiO_2$ film:

| 97.3 pbw | of compound No. 6 (as solution) and |
| 0.1 pbw | of 2-(4-styrylphenyl)-4,6-bis(trichloromethyl)-s-triazine in |
| 2.6 pbw | of 2-ethoxyethyl acetate. |

A thickness of 1,000 nm was obtained after drying for 1 minute at 100° C. A test image mask was brought into intimate contact with the wafer which was exposed for 15 seconds to UV light having an intensity of 4.5 mW/cm² at 365 nm. After waiting for 10 minutes, development was carried out for 45 seconds using the developer from Example 1. The image sample obtained had a resolution of 1,000 nm.

What is claimed is:

1. A radiation-sensitive mixture, comprising:
    a compound that forms a strong acid on exposure to actinic radiation, and
    a polymeric compound containing repeating acid-cleavable acetal or ketal groups,
    wherein the polymeric compound is the reaction product of:
    (i) a polymeric organic compound containing free OH groups,
    (ii) an organic compound containing at least two isocyanate groups or at least two epoxy groups,
    (iii) a compound containing repeating acid-cleavable acetal or ketal groups and at least one free OH group.

2. A radiation-sensitive mixture as claimed in claim 1, additionally comprising a polymeric binder free of acid-cleavable groups.

3. A radiation-sensitive mixture as claimed in claim 2, wherein the binder is water-insoluble and soluble in aqueous-alkaline solutions.

4. A radiation-sensitive mixture as claimed in claim 1, wherein the polymeric organic compound (i) comprises a phenolic resin.

5. A radiation-sensitive mixture as claimed in claim 1, wherein the compound (iii) is a compound containing repeating acetal or ketal groups in the main chain in which each α-carbon atom of the alcohol component of the acetal or ketal units is aliphatic.

6. A process for preparing a radiation-sensitive mixture as claimed in claim 1, comprising the steps of: reacting a compound (iii) containing repeating acid-cleavable acetal or ketal groups and at least one free OH group with an organic compound (ii) containing at least two isocyanate groups or at least two epoxy groups in stoichiometric excess; reacting the reaction product obtained that contains free isocyanate groups or epoxy groups with a polymeric organic compound (i) containing free OH groups; and mixing the polymeric reaction product obtained that contains lateral acid-cleavable groups with a compound that forms a strong acid on exposure to actinic radiation.

7. The process as claimed in claim 6, wherein a compound (iii) containing more than one free OH group in the molecule is used and wherein a part of the organic compound (ii) containing at least two isocyanate groups or at least two epoxy groups is replaced by a compound containing one isocyanate group or one epoxy group respectively.

8. The process as claimed in claim 6, wherein the molar ratio of the compounds (iii) and (ii) is so chosen that each compound (iii) is reacted at least one OH group with an isocyanate group or an epoxy group.

9. The process as claimed in claim 1, consisting essentially of the recited components.

* * * * *